United States Patent
Rapp

(10) Patent No.: US 7,322,863 B2
(45) Date of Patent: Jan. 29, 2008

(54) ROBUST MODULAR ELECTRONIC DEVICE WITHOUT DIRECT ELECTRICAL CONNECTIONS FOR INTER-MODULE COMMUNICATION OR CONTROL

(76) Inventor: Robert Rapp, 1120 Ranchero Way #10, San Jose, CA (US) 95117

( * ) Notice: Subject to any disclaimer, the term of this patent is extended or adjusted under 35 U.S.C. 154(b) by 154 days.

(21) Appl. No.: 10/803,626

(22) Filed: Mar. 18, 2004

(65) Prior Publication Data

US 2004/0198101 A1    Oct. 7, 2004

Related U.S. Application Data

(60) Provisional application No. 60/458,619, filed on Mar. 27, 2003.

(51) Int. Cl.
*H01R 13/502* (2006.01)
(52) U.S. Cl. .................... 439/950; 439/701
(58) Field of Classification Search ............ 439/701, 439/950
See application file for complete search history.

(56) References Cited

U.S. PATENT DOCUMENTS

| | | | |
|---|---|---|---|
| 3,205,298 A * | 9/1965 | Kalt | 174/265 |
| 4,164,362 A * | 8/1979 | Cobaugh et al. | 439/64 |
| 4,546,267 A | 10/1985 | Urfirer | |
| 4,874,731 A * | 10/1989 | Sachtler et al. | 502/66 |
| 4,942,356 A | 7/1990 | Ellingen et al. | |
| 4,969,827 A | 11/1990 | Hahs, Jr. | |
| 4,978,840 A | 12/1990 | Annegawa | |
| 5,655,922 A | 8/1997 | Dux et al. | |
| 6,039,414 A | 3/2000 | Melane et al. | |
| 6,201,698 B1 | 3/2001 | Hunter | |
| 6,402,031 B1 | 6/2002 | Hall | |
| 6,692,310 B2 * | 2/2004 | Zaderej et al. | 439/701 |
| 6,875,282 B2 * | 4/2005 | Tanaka et al. | 118/719 |

OTHER PUBLICATIONS

Robert Rapp (Author) Experiments 1 & 2: The use of Optical Infrared Non-Contact Communication Components in Various Configurations Including a Physically Connected Device.
Robert Rapp (Author): Remarks Background of the Invention in Support of Applicants Invention.

* cited by examiner

Primary Examiner—Truc Nguyen

(57) ABSTRACT

A modular electronic device where (predominantly) sealed modules are aligned and attached/connected in pre-determined sequences, forming a robust block-like structure with extendable function: Control and/or inter-module communication are implemented without direct electrical interconnect, by non-contact means such as (magnetic, inductive, light, infrared, radio frequency, sound, ultrasound, or other non-contact means). This device's inter-module power transfer may be with or without direct electrical contact, or devices may be internally powered. Power transfer through inductive/transformer action where one or more alignment pins are used as transformer core is one potential implementation. Modules may be fluid filled to facilitate cooling and/or crush resistance to high-pressure environments.

4 Claims, 6 Drawing Sheets

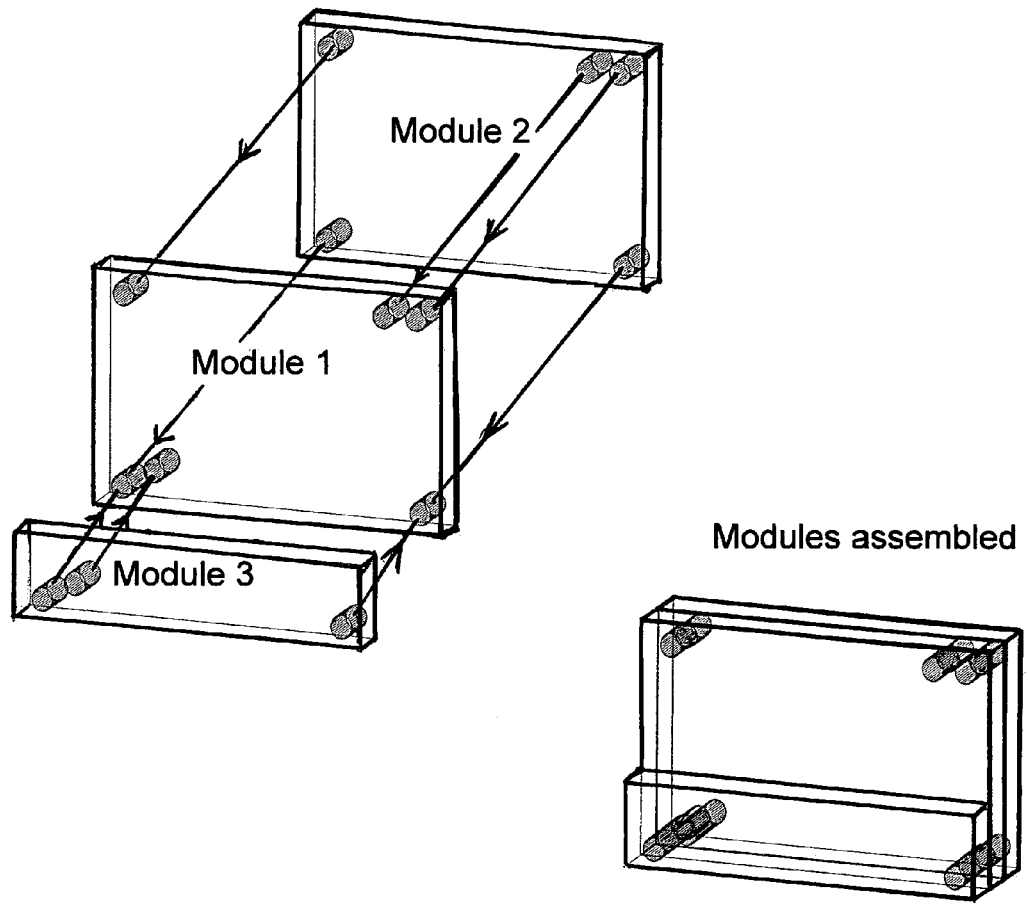
Figure 1: 3D View showing individual
& assembled modules
Notice alignment holes

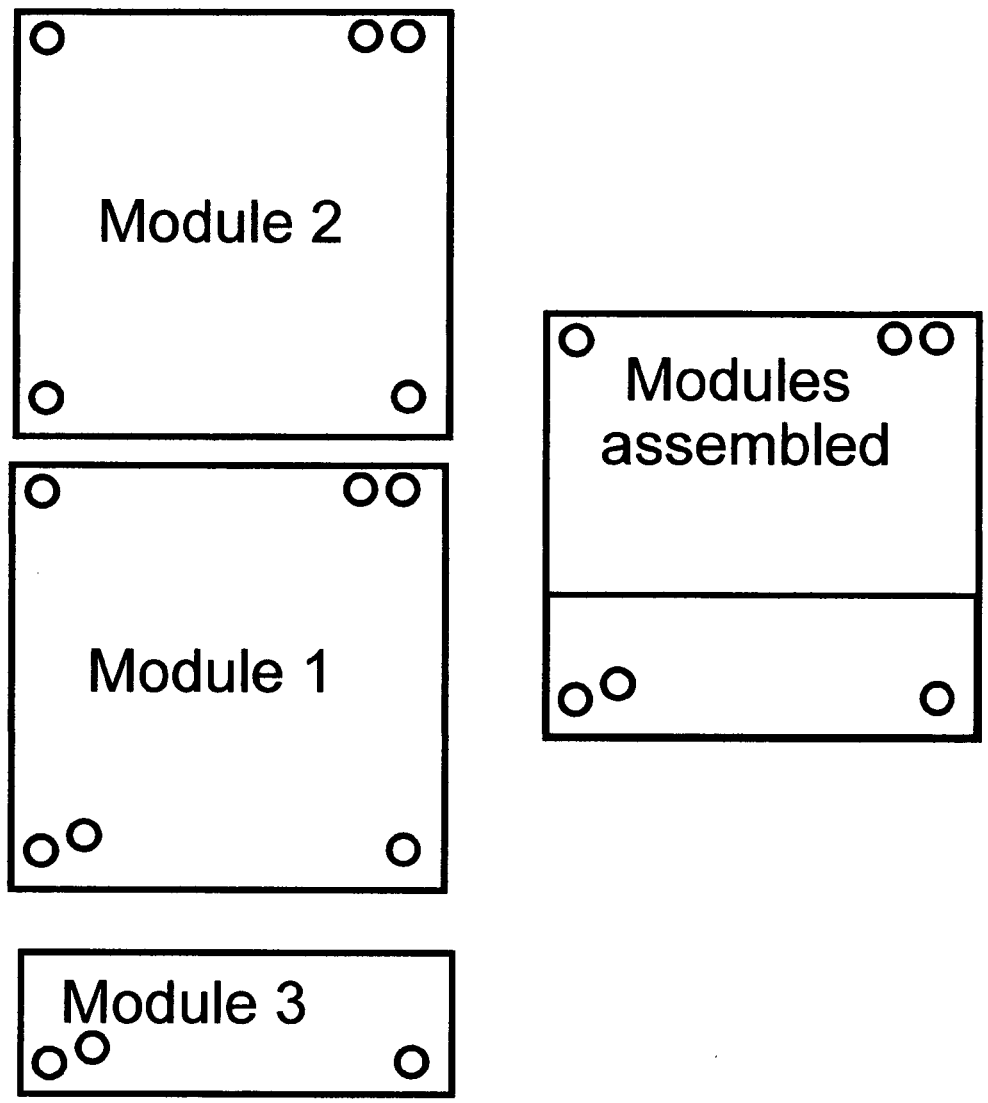
Figure 2: Front View showing individual & assembled modules circles are alignment holes/pins

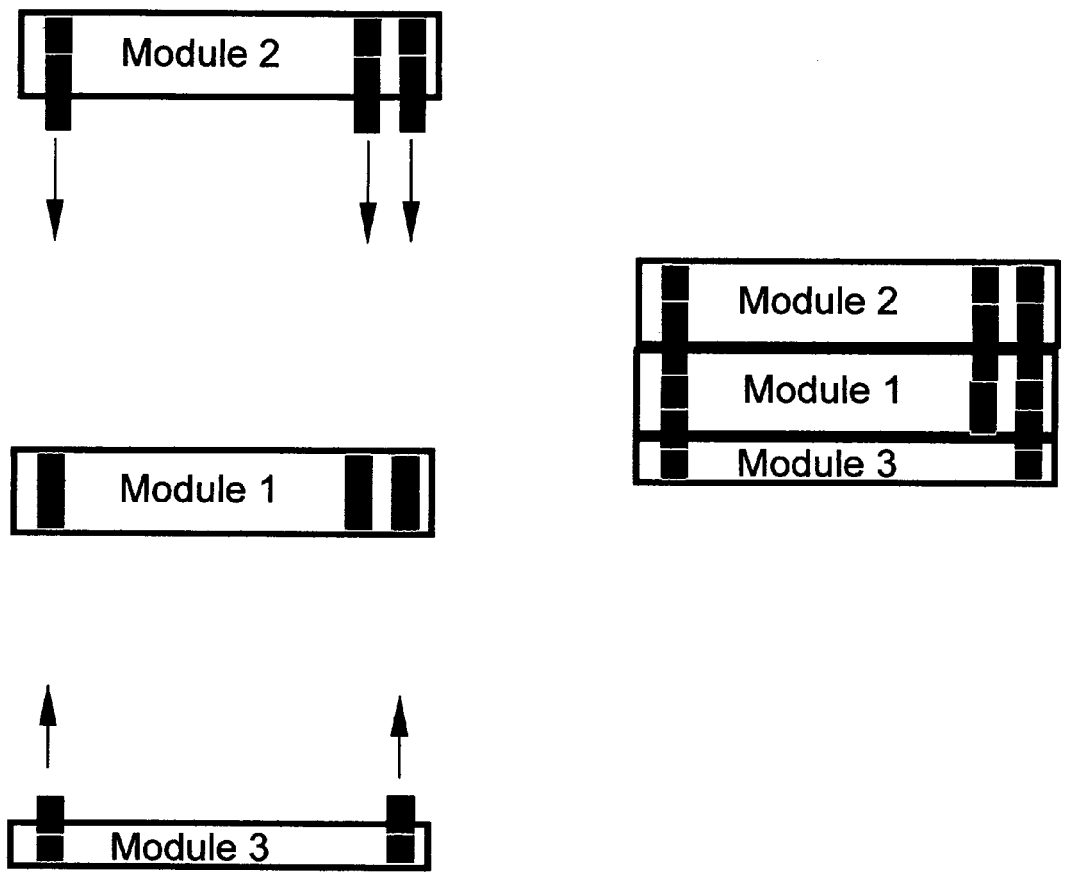
Figure 3: Top View showing individual and assembled modules here black pins fit into grey holes

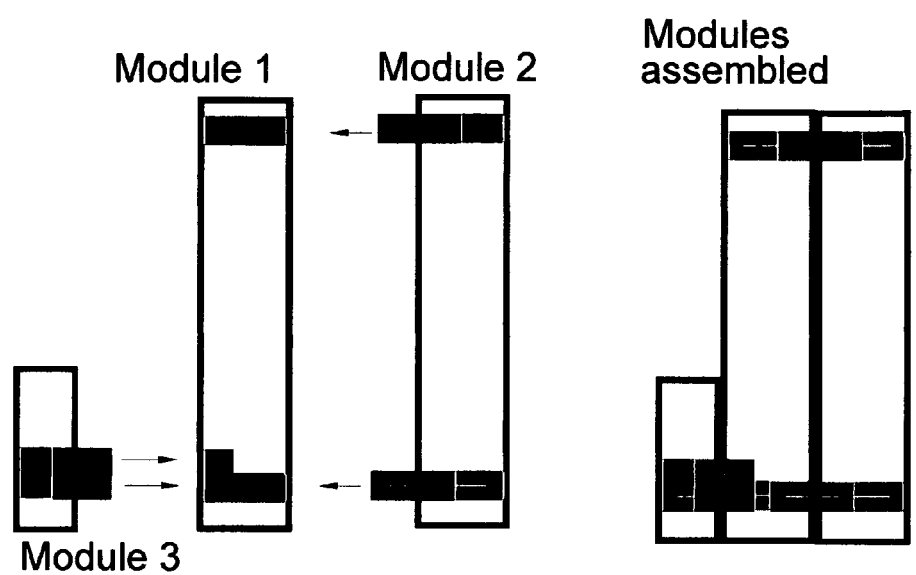
Figure 4: Side View showing individual and assembled modules
here black pins fit into grey holes

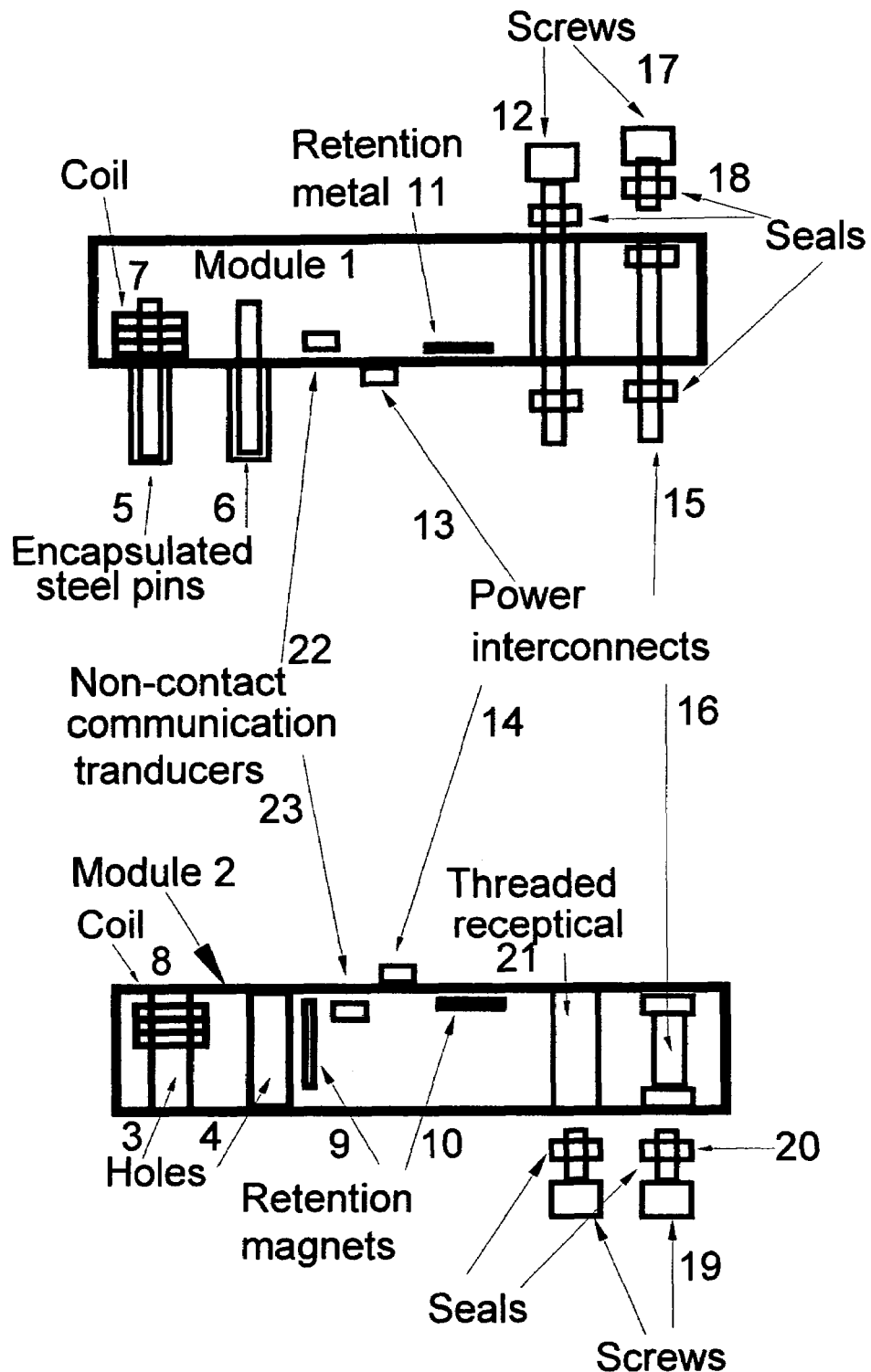
Figure 5: Some possible attachment & power transfer methods

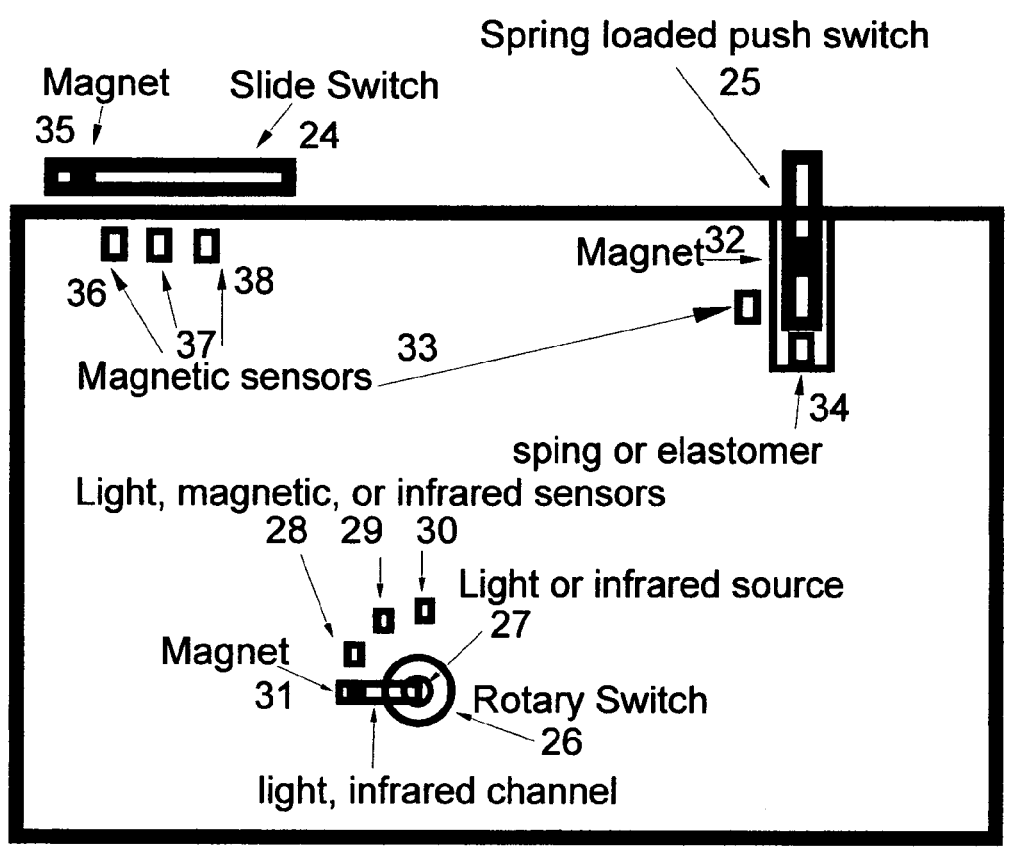
Figure 6: Sensors & switches

ROBUST MODULAR ELECTRONIC DEVICE WITHOUT DIRECT ELECTRICAL CONNECTIONS FOR INTER-MODULE COMMUNICATION OR CONTROL

CROSS REFERENCE TO RELATED APPLICATIONS

This application is entitled to the benefit of Provisional Patent application No. 60/458,619 filed Mar. 27, 2003.

FEDERAL RESEARCH STATEMENT

Not Applicable, this invention was developed without government assistance, it was developed on my time and with my (Robert J. Rapp) resources.

BACKGROUND OF INVENTION

Modular electronic devices typically have numerous (a plurality of) electrical interconnections. These interconnections are subject to shorting, crimping, crushing, ESD, and environmental contamination when those connections/connectors are exposed.

Robust electronic devices are typically built to withstand certain environments, some are built to withstand shock, others are built to withstand rain or dust, while still others are built to withstand immersion in water to various depths. If extendable, these devices typically have to be opened and new components installed inside of the device's enclosure, thus exposing internal components to the external environment. This in turn limits the environment where new components can be installed and exposes internal components to hazards, such as Electro Static Discharge (ESD) or environmental contaminants.

A series of robust electronic modules interconnected in a block like structure without electrical connections for control and/or communication provides a methodology for constructing electronic devices where robustness is built in at the sub-assembly level and lasts throughout the product's lifecycle. These modules may be assembled while in hostile environments without worry for the problems that accompany other approaches. There is no plurality of electrical inter-connections to damage (short, crimp, crush, contaminate, or expose to ESD) and enclosures don't have to be opened to add new components.

With this new modular approach control and/or inter-module communication are performed without direct electrical contact/non-contact means, power may be connected directly, or distributed through a non-contact means.

Furthermore, in this new approach, inter-module power may be distributed by using magnetic induction/transformer action, other non-contact power mechanism, through specially designed electrical interconnects, or modules may be Internally powered.

The inductive power transfer approach provides one solution free from all direct electrical interconnection between modules.

Other non-contact power transfer methods may also be used in this approach

SUMMARY OF INVENTION

A (predominantly) sealed yet extensible modular electronic device where control, and/or inter-module communication are performed without direct electrical contact, by non-contact means and where modules are aligned and connected in predetermined sequences (forming a robust block-like structure with extendable function).

This invention provides a methodology for building robust electronic devices in new ways, in this approach robustness is built in at the sub-assembly (or module) level. The Unique attributes don't stop there, they also include *Extendable while in harsh environments: *No plurality of electrical interconnects to foul (short, crimp, crush, contaminate): *Natively resistant to ESD, shock, dirt, and environmental stress: *Signal fidelity issues are limited to module design constraints: *Electro-magnetic emissions are contained & controlled Thus devices that are waterproof, extendable, configurable, and customizable may be built. Modules remain protected from the sub-assembly level and throughout the product's lifecycle.

Control and/or inter-module communication functions are implemented in various non-contact ways, including magnetic, inductive, light, infrared, radio, sound, ultrasound, or other non-contact mechanism. Power is distributed through magnetic induction/transformer action, light, infrared, radio, sound, ultrasound, through other non-contact mechanism, or through aligned electrical interconnects.

Typically I/O (Input, Output) signals are more sensitive to damage from ESD than are power connections, and power connections are more easy to protect against ESD damage than are I/O signals. Filtering and transient suppression devices on power connections enhance device operation, where these components installed on I/O signals (especially high-speed I/O) degrade the device performance.

In this design I/O signals (those that are the most sensitive to ESD) remain protected inside the module, forever. Power connections implemented by inductive/transformer action provide an electrical contact-less design that is very resistant to ESD. Power connections implemented by direct connection offer high resistance to Electro-magnetic Pulse (EMP) offer modest native resistance to ESD, an attribute that can be enhanced easily and at low cost.

Communication and control (I/O) signals implemented by light, infrared, magnetic, inductive, radio, sound, ultrasound, or other non-contact means gives the designer a choice of characteristics when building a module type.

Thus, different module types may be built, each suitable to a different set of environments and performance characteristics.

Alignment mechanisms for assembling modules include magnetic retention, pins/holes, screws/holes, clamps bands attachment device or recesses/protrusions. Alignment mechanisms align non-contact communication transceivers (light, infrared, magnetic, or inductive), special power interconnects, and/or magnetic/inductive power distribution including where an alignment mechanism or pin acts as a transformer core.

BRIEF DESCRIPTION OF DRAWINGS

Note: the drawings detail some possible implementations for arranging and aligning modules, not all.

FIG. 1: 3D View showing individual modules (Module 1, Module 2, Module 3) & assembled modules. Here alignment holes enable unique alignment of compatible modules.

FIG. 2: Front View showing Individual modules (Module 1, Module 2, Module 3) & those modules after assembly are shown. In this drawing circles represent holes or pins.

FIG. 3: Top View showing individual (Module 1, Module 2, Module 3) and those modules after assembly are shown. In this drawing black pins fit into gray holes and arrows show path of alignment.

FIG. 4: Side View showing individual (Module 1, Module 2, Module 3) and those modules after assembly are shown. Here also black pins fit into gray holes and arrows show path of alignment.

FIG. 5: Some possible attachment & power transfer methods. Several examples of alignment, retention, power transfer mechanisms are shown, such as:

Encapsulated steel pins (5, 6) may be used for alignment or act in conjunction with wire coils (7, 8) to form a transformer and enable inductive power transfer. Pins (5, 6) from Module 1 fit into holes (3, 4) in Module 2.

In this drawing retention magnets (9, 10) are used to grab (magnetically) alignment pins and retention metal (11) imbedded within the module.

A threaded/screw retention method is also depicted; in this case the long screw (12) attaches the modules.

Power interconnects are depicted: points of contact (13, 14): an interconnect on the surface of the module and a power interconnect pin (15) that transfers power through the pin into a receptacle (21) Here screws (17, 19) and seals (18, 20) are depicted sealing the power interconnect.

Communication transducers (22, 23) (non-contact/without direct electrical connection) are also shown. Built into the modules these transducers enable modules to communicate without direct electrical contact.

FIG. 6: Sensors & switches shows several examples of control mechanisms. Switches are shown in slide (24), push button (25), and rotary (26) configurations.

Sensors sense the movement of a magnet, or the presence of a light or infrared source.

A light or infrared source (27) here depicted in a rotary configuration originates from within a module and is guided along the rotary arm (39) a channel used to refract light into a sensor. A magnetic solution is also depicted in the rotary implementation, yet here a magnet (31) is located in the rotary arm. Rotary sensors (28, 29, 30) are used to sense the switches position.

For the push button switch (25), magnet (32) is sensed by sensor (33) when the switch is depressed. A spring or elastic (34) maintains the switches original not-depressed position.

For the slide switch (24), magnet (35) is sensed by sensors (36, 37, 38) to determine switch position.

DETAILED DESCRIPTION

This invention is a methodology for building robust electronic devices from a series of robust modules, where function can be extended even in harsh environments: An extensible non-contact methodology where physically attached/connected electronic modules perform various functions without direct electrical contact. Non-contact/without direct electrical contact functions are scaleable from Inter-module communication, to control, and to power distribution methodologies. This invention relies on the concatenation (summation) of several principals that have not been combined before, or principals that have not been applied to the building of modular electronic assemblies before.

Here a series of circuit blocks or modules are interconnected physically where inter-module communication occurs without direct electrical connection, by non-contact means. Furthermore these blocks may be controlled through non-contact means and may use non-contact power transfer methods. This approach is scaleable from building individual consumer products to building larger scale electronic computer systems. Non-contact principals enable a new method for building electronic devices where robustness starts at the module level and lasts throughout the product's life.

Fundamental Principals:

Sealed modules are resistant to environmental contamination, because internal components are isolated from the environment.

A series of sealed or predominantly sealed modules that can be connected without exposing internal components retain their native resistance to environmental contamination at all times.

I/O (Input, Output) signals, especially high-speed I/O signals are significantly more susceptible to damage from Electro Static Discharge (ESD) than are power interconnects.

By eliminating direct electrical contact for control and/or communication signals, the possibility of damaging these signals by shorting, crimping, crushing, ESD, or environmental contamination are eliminated.

Communication and control signals may be implemented without direct electrical contact (with light, infrared, induction, magnetic, radio, or other mechanism).

It is easier and cheaper to add additional ESD protection to power lines than it is to add it to I/O signals, adding ESD protection to I/O signals often degrades signal quality and device performance. There are typically few power connections and many signals for communication and control.

Power may be transferred with high efficiency through inductive/transformer action. A transformer core may be made from iron or steel pins or rods encircled with an electric coil (many wrappings of wire). This transformer core may be implemented with an alignment pin.

Power may be transferred through other non-contact means, such as heat, light, or radio frequency energy. Typically these other forms of energy transfer have a low efficiency, they however have not been used in a modular-physically connected device before.

Aligning and connecting modules in pre-determined sequences eliminates the need to broadcast signals over distance, thus limiting or controlling emitted radiation.

Radio, including industry standard radio communication techniques enable isolated devices to communicate, if these modules are aligned and connected in pre-determined sequences forming a single physical device (a physically connected device) this constitutes a device consistent with this invention.

Engineering fluids are available which conduct heat away from electronic circuits. Fluids are incompressible; a fluid filled module will have enhanced crush resistance to a high-pressure environment than would a module filled with air or a gas.

The principals above when combined describe a new methodology for building electronic devices, a methodology that offers the designer a choice in how to construct modules and a system consistent with this invention. Unlike other extensible modular designs this device has no groups of electrical interconnects to short, crimp, crush, or fowl, hence the term non-contact modular device as a patent claim. Typical modular devices contain a plurality of electrical interconnects that are aligned and interconnected.

Some of the principals above have not been applied to modular electronic devices before, so when applied to modular electronic devices constitute a unique methodology for constructing modular electronic devices (such as inter-module inductive power transfer, or liquid filled modules for withstanding a high-pressure environment). Non-contact power transfer and liquid filled modules extend the non-contact principal.

Making the Invention

Electronic Assemblies: Modules in this invention consist of an electronic assembly, an enclosure, control mechanisms, communication mechanisms, alignment mechanisms, connection mechanisms, and power transfer mechanisms.

Here the electronic assemblies consist of some form of printed circuit board assembly or electronic integrated circuit that ultimately will be contained within a module enclosure.

Module Enclosures: Module enclosures isolate and protect delicate electronic circuits from the outside world and may be fabricated by various means, including:

Encapsulating the electronic assembly in an extrude-able resin such as epoxy, plastic, glass, polycarbonate, or other.

Mounting the electronic assembly inside of a case that can be made of metal, plastic, glass, polycarbonate, epoxy, or other material.

The exterior of any enclosure type or the interior of a case may be coated or painted with a conductive surface, thus forming a Faraday shield. Modules may be sealed or unsealed.

Module enclosures may be filled with a fluid for cooling and/or for making modules crush resistant when exposed to a high-pressure environment. Fluids have very efficient heat transfer characteristics. Fluids are incompressible and help support the enclosure when the device is in a high-pressure environment.

Non-Direct Electrical Contact Inter-module (Non-contact) Communication Mechanisms: Control and Inter-module communication mechanisms are without direct electrical contact and include light, infrared, radio, magnetic, inductive, sound, ultrasound, or other without direct electrical contact mechanism (receiver, transmitter, transceiver).

Light, infrared, magnetic, or inductive means require close physical proximity and/or line of sight transmission. With these communication mechanisms, alignment and connection of transmitting & receiving elements is required.

Light and infrared transmitters, receivers, or transceivers can be purchased and built Into a module. Inductive elements can be built by with coils of wire and constructed into a modules outer surface, or be built into the modules alignment mechanisms.

Alignment pins may also be used to increase efficiency (focus transmitted communications onto receivers) of inductive elements or other non-direct electrical contact communication or power distribution mechanisms, including sound/ultrasound.

Typically if radio is used as a communication mechanism alignment & physical connections are not required for function, in this design however alignment and physical connection of modules are attributes that keep modules together as a single physical entity. Being one physical entity, the overall device is easy to transport. In this respect modules" that communicate by radio, even industry standard radio implementations built with physical connections fall under the scope of this new approach.

Furthermore, depending on implementation, once connected each module's radio signals could be contained within a Faraday shield and therefore no longer broadcast into the outside environment.

Communication transmitters/receivers/transceivers/antenna can be molded into the enclosure, tapped & screwed into the enclosure, or be mounted on the electronic assembly and shine through a window in the case.

Non-Direct Electrical Contact (Non-Contact) Control Mechanisms: Control mechanisms can be built with light, infrared, magnetic, radio, sound, ultrasound, sources/receivers, or with sealed switches. Control the device by aligning a source with a receiver built into the device.

Materials are available to make sources and sensors of various sorts. Magnetic switches and materials for making them have been described for over 25 years. This design may use various sorts of switches and sensors including, but not limited to:

A slide, rotary, plunger, or other mechanism: pointer with a magnet built in: Slide, rotate, or depress. Move the magnet In front of a magnetic sensor to select a function: the sensor is sealed in the device.

Magnetic sensor built with a magneto-resistive element to set the bias point of a transistor; typically the transistor is off, when a magnet is aligned with the magneto-resistive element the transistor turns on, which acts as a magnetic switch.

Inductive loop that senses a changing/moving magnet/magnetic field. Moving a magnet over a small coil would create a pulse that could be used as a control signal.

A slide, rotary, or other mechanism/pointer that uses, directs, refracts, or reflects light or infrared energy that is used as a control signal. Light from inside the module could be refracted through the mechanism and back into sensors inside the module where they can be used as control signals.

A pointer or device that sources or directs source energy into a receiver: such as pointer tipped with a magnet or light used to select function.

Alignment and Attachment/Connection Mechanisms: Alignment and attachment/connection mechanisms may include magnetic retention, pins/holes, screws/holes, clamps/bands/attachment-device or recesses/protrusions. Essentially there are many ways to align and connect modules, the designer is free to choose which approach Is best for the application.

A minimum of one geometric protrusion with a corresponding recess or a minimum of two pins and holes are possible implementation methods.

Alignment mechanisms used as a non-direct electrical contact power transfer mechanism is a unique implementation alternative of this approach.

Alignment mechanisms used as a transformer core is a unique implementation alternative of this design. In this case coils are located inside each enclosure, and an alignment mechanism such as a pin acts as a transformer core: as in FIG. 5 (5).

Alignment mechanism used as a method to increase efficiency of non-direct electrical contact communication mechanisms is a unique implementation alternative of this approach.

Alternatively alignment mechanisms align electrical power connections.

Power Mechanisms: Power transfer mechanisms include inductive/transformer action: Inductive coils arranged and aligned to maximize flux transfer between modules through transformer action using the alignment mechanisms as a transformer core. Transferred energy may be supplied to a charge pump, power regulator, power converter, or may charge a high value capacitor. Thus devices may be powered continuously or by delivering pulses of power.

Alignment mechanisms working as a transformer core is a unique alternative implementation of this approach. In this case coils are located inside each enclosure, and an alignment mechanism such as a pin acts as a transformer core: as in FIG. 5 (5).

Alternatively alignment mechanisms align electrical power connections, devices may be internally powered, or devices may have other non-contact power transfer methodologies such as heat, light, radio frequency energy, sound, or ultra-sound, or other method.

Note prior art exists where energy and data are transferred by light, where an IC card has no physical contact with another IC card and the IC card fits into a recess. This design is not extendable and does not consist of groups of modules that are physically connected in sets of predetermined sequences.

Modules may also be internally powered, an internal battery or solar power cell are possible implementations.

Usage Model: The use model for this device is unique, as the device may be expanded even in harsh environments without worry of damaging a plurality of electrical signal interconnects (shorting, crimping, crushing, ESD, and environmental contamination).

Examples 1 and 2 below have the same usage model yet slightly different implementations. Numerous other implementations are possible. Here the use model is that a diver wishes to perform underwater digital photography. Before beginning his dive he connects the power module to the camera module and jumps into the water. After taking numerous photographs, he runs out of memory. No problem as he has brought along a memory module, he simply aligns and connects the memory module to the camera module, turns on the camera and continues taking photos. After returning home he connects his interface adapter module and connects his camera to his computer where he downloads his photos onto his computer.

Other types of electronic devices (computers, video camera, Mpeg players, or other) may be built in similar ways and be extensible. Modules may be designed to be cascade-able (such as connecting several memory modules one to the other), or may be designed using other forms of non-contact inter-module communication.

EXAMPLE 1

Assumptions for One Hypothetical application, an implementation with no inter-module electrical connections:
There is a main function module, which contains an electronic camera, a small LCD screen, magnetic control switches, a small memory, a flash unit, and strategically located inductive receiver/transmitter pairs.
A second module, a power module has alignment pins that fit into alignment holes on front side of the camera. One alignment pin acts as the core of a power transformer. Power is conducted inductively to and potentially through the camera module to other modules. A magnet inside of the camera module applies a retention force to the second alignment ping that holds the modules together.
A third module, a memory extension module connects to the backside of the camera through small alignment pins. This module like module 2 is magnetically retained, and contains an inductive power transfer element. Here, however the alignment pins also align inductive transmitters and receivers used to transfer data between modules 1 and 2.
A fourth module, aligned magnetically retained and inductive powered, also contains inductive transmitters/receivers. This module is an interface adapter that converts an inductive signal into USB.

EXAMPLE 2

Assumptions for one Hypothetical application, an implementation with direct power interconnects:
There is a main function module, which contains an electronic camera, a small LCD screen, magnetic control switches, a small memory, a flash unit, and strategically located inductive receiver/transmitter pairs.
A second module, a battery module has small alignment pins that fit into alignment holes on the left side of the camera. These alignment pins align power and ground connections which connect when the modules are pressed together. Magnets inside of the camera module apply retention force that holds the modules together.
A third module, a memory extension module connects to the right side of the camera through small alignment pins. This module like module 2 is magnetically retained, and contains power interconnects. Here, however the alignment pins also align inductive transmitters and receivers used to transfer data between modules 1 and 2.
A fourth module, aligned magnetically retained and powered similarly to above, also contains inductive transmitters/receivers. This module is an interface adapter that converts an inductive signal into USB.

EXAMPLE 3

In this case the implementation is a sealed yet extendable computer built with features of this new method, yet in this case one or more modules are liquid filled. The fluid cools electronic components and/or provides resistance to crushing when in a high-pressure environment. In this example the fabrication process includes:
The case consists of two pieces, a top and a bottom.
The electronic module is mounted inside the case's bottom part and connected to non-contact communication transceivers and power mechanisms.
The top of the case is sealed onto the bottom using epoxy, gasket material, RTV, silicone, or other airtight sealing mechanism that (potentially) conduct heat through the seal.
The module is filled with a liquid (such as Flourinert 3M trademarked coolant, or a non-electrically conductive oil) through a small access hole.
The access hole is itself sealed thus completing the module's assembly.

The invention claimed is:
1. A modular electronic device, comprising:
a first electronic module including a first communication mechanism configured to facilitate transmission and reception of high speed communication input/output signals;
a second electronic module including a second communication mechanism configured to facilitate transmission and reception of high speed communication input/output signals with the first electronic module without direct electrical contact;
a third electronic module including a third communication mechanism configured to facilitate transmission and reception of high speed communication input/output signals with other first and second modules without direct electrical contact;

an alignment attachment mechanism constructed to align and retain the modules relative together to one another;

wherein the alignment attachment mechanism comprises a plurality of first protrusions and plurality of holes on each of the first, second and third electronic modules; and wherein the plurality of the protrusions physically engaging the holes; and wherein the high speed communication input/output signals are transmitting and receiving between the modules via the alignment attachment mechanism without electrical contact.

2. A modular electronic device as in claim 1, wherein the alignment attachment mechanism is constructed to rigidly retain the first, second and third electronic modules together.

3. A modular electronic device as in claim 1, wherein the alignment attachment mechanism comprises a magnet coupled the first, second and third electronic modules together.

4. A modular electronic device as in claim 1, wherein the alignment attachment mechanism comprises a metallic protrusion on one of the first, second and third electronic modules and a hole comprising magnet on the other of the first, second and third electronic modules.

* * * * *

Disclaimer

7,322,863 — Robert Rapp, San Jose, CA (US). ROBUST MODULAR ELECTRONIC DEVICE WITHOUT DIRECT ELECTRICAL CONNECTIONS FOR INTER-MODULE COMMUNICATION OR CONTROL. Patent dated January 29, 2008. Disclaimer filed July 10, 2008, by the Inventor, Robert Rapp.

Hereby enters this disclaimer to the remaining term of said patent.

*(Official Gazette November 25, 2008)*